(12) United States Patent
Cranfill et al.

(10) Patent No.: US 7,242,784 B2
(45) Date of Patent: Jul. 10, 2007

(54) DYNAMIC GAIN CONTROL OF AUDIO IN A COMMUNICATION DEVICE

(75) Inventors: David B. Cranfill, Sparta, NJ (US); Kesavarajan Kaliyaperumal, Edison, NJ (US); Arthur G. Herkert, Millington, NJ (US); Ronald Crochiere, San Diego, CA (US)

(73) Assignee: Motorola Inc., Schaumburg, IL (US)

( * ) Notice: Subject to any disclaimer, the term of this patent is extended or adjusted under 35 U.S.C. 154(b) by 934 days.

(21) Appl. No.: 09/946,109

(22) Filed: Sep. 4, 2001

(65) Prior Publication Data

US 2003/0044028 A1    Mar. 6, 2003

(51) Int. Cl.
H03G 3/00 (2006.01)
H04M 1/00 (2006.01)
G10H 1/02 (2006.01)
G10H 5/00 (2006.01)

(52) U.S. Cl. ............ 381/107; 381/104; 381/109; 455/569.1; 84/702; 84/663

(58) Field of Classification Search ........... 381/107, 381/104, 109; 455/569.1
See application file for complete search history.

(56) References Cited

U.S. PATENT DOCUMENTS 3,789,143 A    1/1974   Blackmer
4,182,993 A    1/1980   Tyler
4,539,526 A    9/1985   Davis
4,715,063 A    12/1987  Haddad et al.
4,741,018 A    4/1988   Potratz et al.
5,396,562 A *  3/1995   Ishimitsu et al. ........... 381/107
5,398,562 A *  3/1995   Muchmore ..................... 74/6
5,579,404 A *  11/1996  Fielder et al. .............. 381/106
6,084,974 A *  7/2000   Niimi ........................ 381/104
6,370,254 B1 * 4/2002   Gore et al. ................. 381/104
6,741,966 B2 * 5/2004   Romesburg ................. 704/500
6,744,882 B1 * 6/2004   Gupta et al. ........... 379/387.01

OTHER PUBLICATIONS

Applicant's admitted piror art, p. 1, lines 17-25.*
Applicant's admitted prior art, p. 1, lines 17-25.*

* cited by examiner

*Primary Examiner*—Vivian Chin
*Assistant Examiner*—Devona E. Faulk
(74) *Attorney, Agent, or Firm*—Brian M. Mancini; Randall S. Vaas

(57) ABSTRACT

A method for dynamically controlling audio signal gain in a communication device starts with determining a level of an input audio signal. The level is then mapped against a table of predetermined corresponding gain targets to determine an appropriate gain target for that level. The gain targets are then applied to the audio signal, which is then output. The invention is particularly suited to speakerphone operation in a communication device, wherein the gain targets provide compression, expansion or limiting so that distant speakers can be heard clearly.

10 Claims, 3 Drawing Sheets

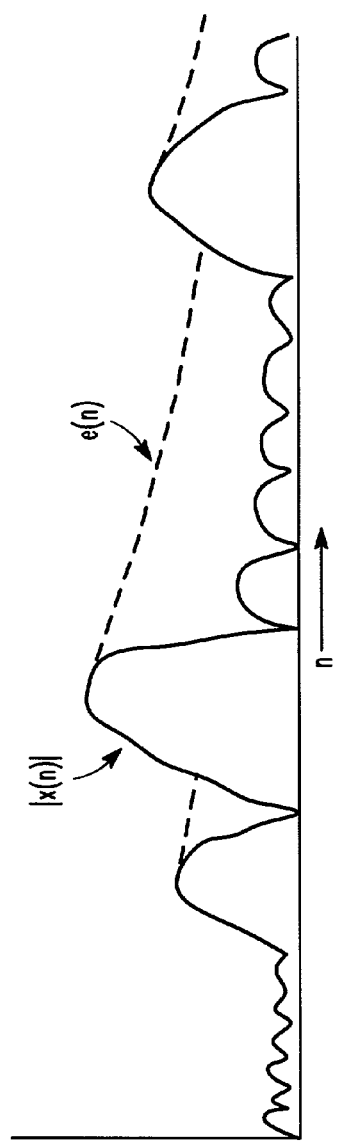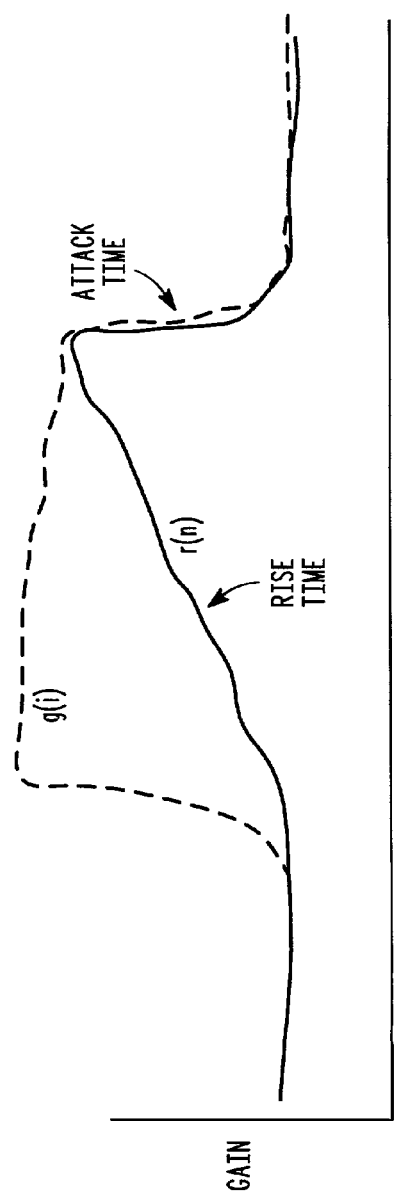

DYNAMIC GAIN CONTROL OF AUDIO IN A COMMUNICATION DEVICE

FIELD OF THE INVENTION

The present invention relates generally to audio gain control, and more particularly to dynamic audio gain control that can advantageously be utilized in communication devices.

BACKGROUND OF THE INVENTION

In both radio and landline telephone systems, a user typically communicates by means of a handset that includes a speaker at one end which is placed close to the user's ear and a microphone at the other end which is held close to the user's mouth. Thus, the user has only one free hand since the other must be used to hold the telephone handset. In order to provide a greater degree of freedom to the user, speakerphones have been developed for use in telephone systems.

A conventional speakerphone, when enabled, allows hands-free use of the telephone while still communicating with another party. However, when a speakerphone is used in a phone conversation there often heard a large disparity in volume between users who are talking close to the speakerphone and those that are distant from the speakerphone. In addition, there are often differences between different user voice levels, which can compound the disparity in volume. Moreover, when a speakerphone function is designed into portable electronic devices, such as radiotelephones, the disparity in user voice levels through the speakerphone is further compounded due to the power limitations of this type of device.

An important problem in the design of portable audio appliances, such as radiotelephones, is that of dealing with acoustic limitations and power limitations of the audio subsystem. This is inherent in the limited size of the acoustic devices used and the power limitations of the audio circuits, particularly in view of the limited power available from a battery. As a result, too much gain in the audio circuits will cause distortion in a device due to either power limitations or acoustic limitations.

Accordingly, there is a need for an improved audio system in a communications device. In particular, it would be of benefit to provide improved audio quality such that low level voices or sounds could be heard as well as high level voices or sounds. It would also be advantageous if such improvement could be provided in a flexible and low cost implementation.

BRIEF DESCRIPTION OF THE DRAWINGS

FIG. 2 shows a graphical representation of envelope tracking, in accordance with the present invention;

FIG. 3 shows a graphical representation of rise time control, in accordance with the present invention;

DETAILED DESCRIPTION OF THE PREFERRED EMBODIMENTS

The present invention provides an improved audio system in a communications device. In particular, the present invention provides dynamic gain control of audio signals using configurable coefficients so as to improve audio quality such that low level voices or sounds could be heard as well as high level voices or sounds. This is accomplished using existing hardware, such as a digital signal processor (DSP), which provide the signal processing functions in the communication device and memory for storing the coefficients. The present invention is also flexible in that the audio performance of a communication device can customized for different uses by downloading the appropriate coefficients for each audio mode. In addition, audio performance can be customized for different communication devices by loading appropriate coefficients in the memory of that particular communication device during its manufacture.

The present invention is advantageously used in any audio subsystem, and can even be used for loudspeakers. The use of gain mapping allows for a completely arbitrary and easily changeable transfer function for producing a wide range of gain control over an audio signal. The present invention provides functions of compression, expansion, limiting, and any other type of dynamic range and loudness modifications in a way that only critical areas of the gain transfer curve need to be specified. The present invention can be implemented on a very compact and cost effective way, which is desirable for small audio devices such as radiotelephones, for example.

Figure 1:
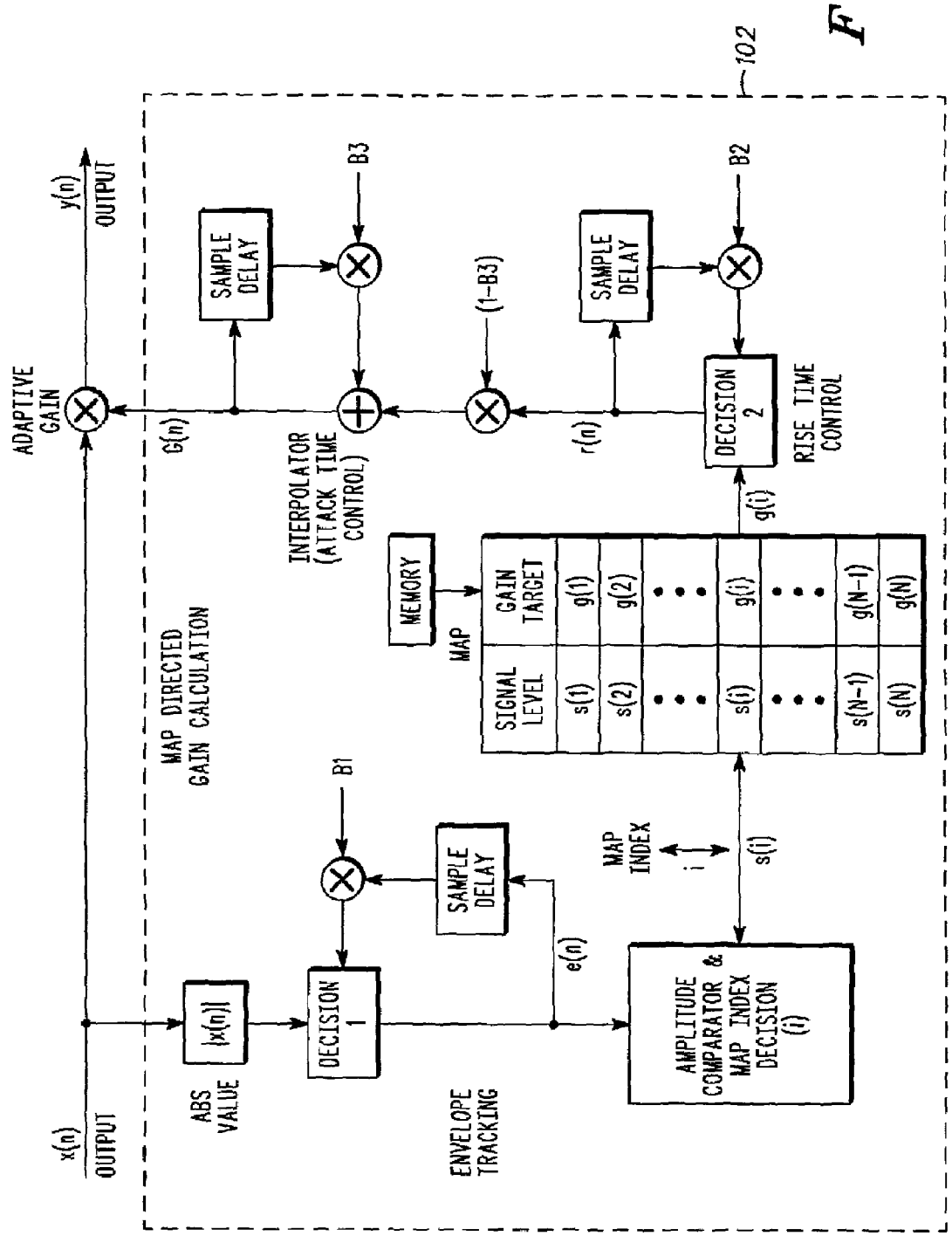
FIG. 1 shows a simplified schematic diagram of a dynamic gain control audio system, in accordance with the present invention.

FIG. 1 illustrates an apparatus with gain mapping, in accordance with the present invention. Input and output audio signals, x(n) and y(n), can be any digitally sampled audio signal which is input or output to various audio circuitry as is known in the art. For example, the input signal can be a signal from a microphone, wherein the output signal is applied to further amplification or transmission circuits. Alternatively, the input signal can be a received or amplified signal and the output signal can be applied to a speaker. The present invention is equally applicable to both situations. In a specific example of a communication device, such as a radiotelephone, the input signal can be a signal from a suitably amplified microphone and the output signal is applied to modulation and transmitter stages. Similarly, the input signal can be a signal from a receiver and demodulation stage and the output signal is applied to a suitably amplified speaker, such as can be used in a speakerphone mode, for example. In addition, the present invention can be implemented equally well in wired or wireless communication devices. It is particularly well suited to radiotelephones due to their limited power and limited audio transducer range. In addition, radiotelephones have existing audio, memory, control and signal processing capabilities to realize the gain mapping function of the present invention.

Referring to FIG. 1, an audio input signal, x(n), is processed by an adaptive gain signal G(n) to produce an output signal y(n) that is compressed, expanded, or limited in some way, as described by a Map table, so as to improve the quality of the output in a desirable way. The output signal y(n) could be a signal to a loud speaker for example, or the signal x(n) could be a signal from a microphone as another example. The nature of the dynamic range manipulation of the signal is controlled by the Map table, which can be dynamically downloaded into the circuit for different modes of the device operation.

The determination of the adaptive gain signal G(n) is achieved through a MAP directed gain calculation as shown in the dotted box 102 of FIG. 1. The absolute value of the input signal |x(n)| is calculated and applied to an envelope tracking circuit. The envelope tracking circuit estimates the signal envelope of |x(n)| by comparing the value of |x(n)| with a running envelope estimate, e(n). In a comparator in Decision 1 box, the new value of e(n) at sample time n is selected to be the larger of the values |x(n)| or the value B1 times e(n−1) (the previous value of e(n)). This is described by the equation:

$$e(n)=\max\{|x(n)|, B1(e(n-1))\} \quad \text{(envelope tracking)}$$

The value of B1 controls the slope of the envelope detection. B1 is selected to be a positive number less than one (a typical value might be B1=0.98), which allows the value of B1 e(n−1) to exponentially decay. It should be recognized that the decay could also be tailored to be linear or logarithmic.

Figure 5:
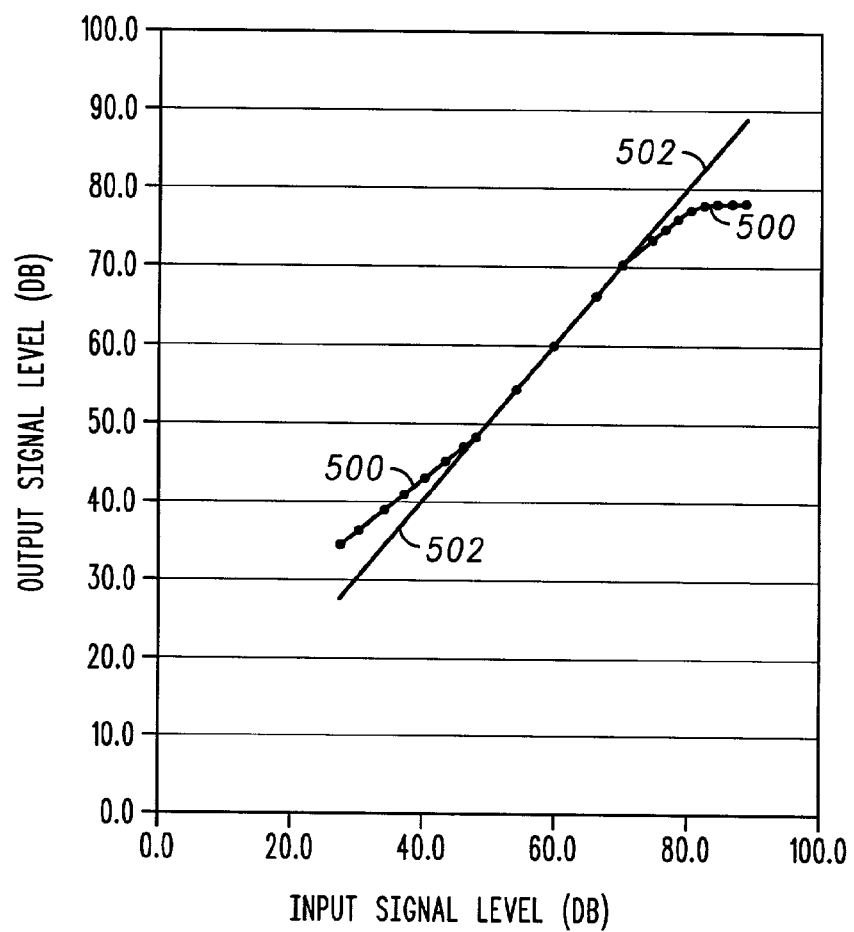
FIG. 5 shows a graphical representation of an audio transfer function, in accordance with a second embodiment of the present invention.

FIG. 2 illustrates the behavior of the envelope tracking circuit where the dotted curve represents the envelope e(n) of the absolute value of the signal |x(n)|. The signal envelope e(n) is then applied to an amplitude comparator, as shown in FIG. 1, to compare its value against a signal level specified in the MAP table. The MAP table is comprised of a predetermined set of signal amplitude values s(i) and target gain values g(i) where i represents the table index value and N represents the number of table entries. The MAP table defines the target gain values versus signal valued for dynamic signal control of the audio signal in accordance with the present invention. The MAP table can have an arbitrary shape and an arbitrary spacing to characterize the desired mapping. FIG. 5 illustrates an example of an N=20 point MAP transfer function where the signal values s(i) and g(i) are shown in a dB scale for better visual illustration. It should be noted that the actual table values in the implementation are absolute numbers, not dB numbers. This MAP transfer function shows that the target gain g(i) is varied from +7 dB to −10 dB over a signal range of 25 dB to 90 dB, which is a typical audio dynamic range. FIG. 5 also shows that the spacing of the values is non-uniform in the middle of the table where the gain target is flat. This gain table translates the target input to the output curve shown, where the benefit of non-uniform spacing in the critical areas if the carve is apparent. This non-uniform flexibility in the present invention affords a low complexity, minimum size N for low memory storage, and therefore low cost while retaining control over the critical regions of needed gain control.

Several means are possible to perform the MAP index decision. For example, the envelope signal e(n) can be sequentially compared against the s(i) values from bottom to top until the index is found where the value of e(n) exceed a value s(i). Another procedure, which saves computation is to start the search at the previous index value and compare the value of e(n) against the MAP values s(i), s(i−1) and s(i+1). This approach saves computation by assuming that the signal envelope e(n), for practical signals such a speech, do not change dramatically from sample to sample. It implies however that there may be a tracking time of up to N simples for the envelope to step from the bottom of the table to the top, which could lead to a slower attack time for the gain control. Another approach is to do a selective search starting from the past index value and searching up or down to the top or bottom of the table depending on whether g(n) is greater or less than he pact value if s(i). Yet another way is to combine the above approaches using different searching means depending on whether the signal envelope e(n) is increasing or decreasing (i.e. different attack and decay responses).

Once the index i is determined, the target gain value g(i) can be selected. Typically, it is desired that this target gain have a fast attack time and a slow rise or release time. That is, it is often desired that the gain value G(n) be dropped rapidly if there is a step function in the input signal x(n) and released slowly if the envelope if x(h) becomes small. This control of the rise time and attack time is accomplished by processing of the target values, g(i), as shown in FIG. 1.

The rise time control is accomplished by comparing the value of g(i) against a running intermediate gain value estimate, r(n). The value r(n) is determined in a comparator in Decision 2 box, as shown, wherein g(i) is compared against a value B2 times r(n−1) (the previous value of r(n)). This is described by the equation:

$$r(n)=\min\{g(i), B2(r(n-1))\} \quad \text{(rise time)}$$

The value of B2 controls the slope of the rise time. B2 is selected to be a positive number slightly greater than one so that the value B2 time r(n−1) increases exponentially. For example, a typical value for B2 might be 1.001. It should be recognized that the decay could also be tailored to be linear or logarithmic. At a sampling rate of 8 kHz, the rise time of the running intermediate gain estimate is about +13.9 dB per 200 ms, which is a typical rise time that is desired for speech processing.

Decision Box 2 compares the target value g(i) against the constantly rising value of r(n) and limits r(n) when it exceeds the target value. Decision Box 2 also ensures that the gain value stays within the limits set by the Map table. FIG. 3 illustrates this limiting behavior where the dotted line illustrates the table values g(i) plotted against the sample time n, and the solid line illustrates the resulting value of r(n), which is limited to g(i) values. As shown, r(n) has a slow rise time and a fast attack time when the target gain values g(i) drop.

The interpolator in FIG. 1 controls the attack time and prevent "chattering" or sudden changes of the gain as a result of the potentially sparse Map table values. For example, the interpolator can be implemented using a first-order low pass (digital) filter that controls the speed at which r(n) changes. For 8 kHz sampled speech, a typical value of B3 might be 0.96, which gives a low pass exponentially decaying impulse response with a time constant of about 2 ms. It should be recognized that the decay could also be tailored to be linear or logarithmic. This smoothing filter controls the rate at which the attack time of r(n) can vary, and keeps the circuit from "chopping" the signal. The output of the interpolator is then the desired gain value G(n) to be applied to the input signal x(n) to produce the dynamically controlled gain output y(n), the modified audio signal. It is envisioned that the interpolator will advantageously control the attack time, such that where the change is not to fast, the interpolator will have no impact on the attack time, whereas when the attack time would be very fast, the interpolator will limit the rate of change to maintain the rate of change below a level which would be annoying to a user.

Figure 4:
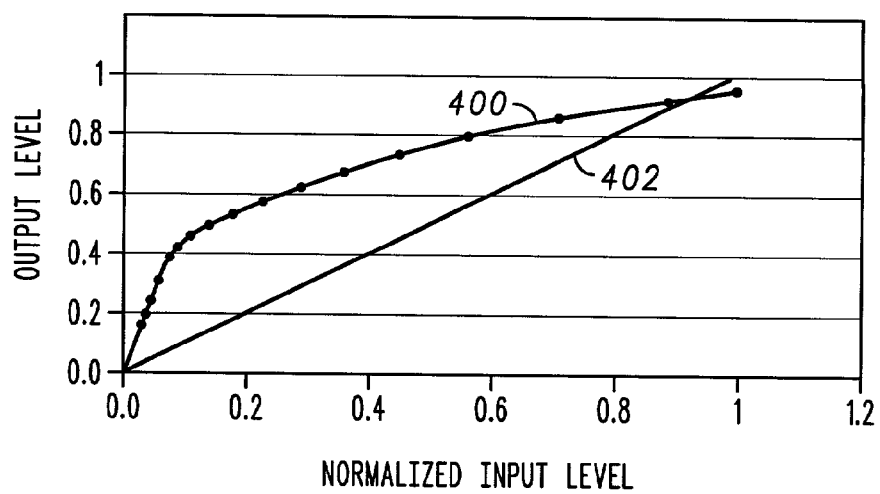
FIG. 4 shows a graphical representation of an audio transfer function, in accordance with a first embodiment of the present invention.

FIG. 4 illustrates the transfer function 400 for a first embodiment of the present invention wherein the transfer function is tailored to improve speakerphone performance in a communication device, such as a radiotelephone for example. This is compared to a typical linearized gain function 402 as is found in the prior art. For this representation, a communication device is operated at a far end of a conversation using speakerphone mode. At the far end of the conversation, there are people spaced apart in a room at various distances from the speakerphone. The people also have different voice levels. On the receiving end of the conversation is another communication device, operated in either speakerphone mode or not in speakerphone mode. The present invention provides the transfer function shown, which compresses the average voice level difference between people on the speakerphone from an energy ratio of about 10:1 down to about 2:1. In this way, the total audio output signal can be increase by a factor of about 8 dB for those participants located close to the speakerphone and about 15 dB for those participants located at a distance from the speakerphone.

The transfer function is stored in a memory and is preferably mapped and implemented in a DSP, as explained previously. The transfer function can be implemented in either the remote communication device (operating as a speakerphone) or the local communication device at the receiving end of the conversation, i.e. the transfer function can be implemented in the receiver, transmitter path, or both the transmitter and receiver paths of communication devices. An example of a transfer function implemented in the speaker path at the speakerphone location will now be described. In this location, the device is best suited to knowing whether it is in a speakerphone mode, and can automatically switch to the compressed transfer function shown. In other words, appropriate coefficients are entered into the mapping table to accommodate the speakerphone mode. The transfer function itself shows normalized input and output levels. For purposes of this representation, the level shown can be indicative of a voltage level. For example, a level of 1.0 represents the maximum peak signal handling capability of the communication device, normalized to a level of 1.0. Therefore, it is desirable to limit the peak audio signal such that it does not exceed this maximum, which would cause distortion. Experimentation has provided coefficients for a transfer function for a speakerphone mode, as shown in Table 1.

TABLE 1

Speakerphone Transfer Function

| Input Level | Output Level |
|---|---|
| 1.000 | 0.962 |
| 0.891 | 0.926 |
| 0.708 | 0.858 |
| 0.562 | 0.794 |
| 0.447 | 0.736 |
| 0.355 | 0.681 |
| 0.282 | 0.631 |
| 0.224 | 0.584 |
| 0.178 | 0.541 |
| 0.141 | 0.501 |
| 0.112 | 0.464 |
| 0.089 | 0.430 |
| 0.071 | 0.398 |
| 0.056 | 0.316 |
| 0.045 | 0.251 |
| 0.035 | 0.200 |
| 0.028 | 0.158 |

In practice, values can be interpolated between points. For example, a participant that is distant from the speakerphone may have a normalized average input level of over 0.07. From the desired mapping table, this would provide a target gain of about 0.40, or an increase in output of about 15 dB. In tests, such a signal would have a typical peak input level of about 0.28, and a peak output level of about 0.63, both of which are below the distortion-resulting level of 1.0. A participant that is close-in to the speakerphone may have an increased normalized average input level of about 0.22, for example. From the desired mapping table, this would provide a target gain of about 0.58, or an increase in output of about 8 dB. In tests, such a signal would have a typical peak input level of about 0.89, and a peak output level of about 0.93, both of which are still below the distortion-resulting level of 1.0. Therefore, the speakerphone transfer function in accordance with the present invention is accomplished without clipping and with less distortion than prior systems. Furthermore, the level difference between the close-in and distant participants has dropped from about 10 dB to about 3 dB making the speakerphone conversation much easier to hear. The present invention also envisions a controlled attack time and delay time to control the slope of gain changes to reduce instantaneous gain changes, which would sound harsh.

The present invention also envisions a method for dynamically controlling audio signal gain in a communication device. The method includes a first step of inputting an audio signal. The input audio signal can be a digital or analog signal. Analog signals are sampled and converted to digital signals. Preferably, the audio signal is sampled at regular intervals. A next step includes determining a level of the audio signal. The level is most commonly measured as a voltage for example, and can be normalized for gain mapping purposes. In particular, the determining step includes determining an envelope value of the audio signal to indicate the level of the audio signal for use in the mapping step. The envelope value is the larger of an absolute value of the amplitude of the audio signal and an envelope estimate of the audio signal. In order to alleviate abrupt gain changes or harsh sounding audio, the determining step further comprises the substep of tracking the envelope estimate of the audio signal, wherein the envelope estimate is allowed to decay exponentially.

A next step includes mapping the level of audio signal against a table of predetermined corresponding gain targets to determine an appropriate gain target for that level. The mapping step includes the gain targets that describe a transfer function mapped to the input audio signal level. The transfer function can provide one or more of audio expansion, compression, and limiting of the audio signal. The level steps of the transfer function are not necessarily uniform, but benefit by being spaced at irregular intervals, with the steps between levels being spaced more closely within critical audio levels. In particular, in those applications in a communication device having a speaker with a speakerphone mode of operation, the mapping step includes gain targets describing a compression of the audio signal such that a low amplitude audio signal is increased in gain. In order to further alleviate abrupt gain changes or harsh sounding audio, a next step can include estimating an intermediate gain value, wherein the intermediate gain value is the lesser of the gain target from the mapping step and a running intermediate gain value. The intermediate gain value controls a rise time of the audio signal and is allowed to increase exponentially. A further step of low pass filtering can be includes, wherein the intermediate gain value is filtered using a low pass exponentially decaying impulse response filter to control an attack time of the gain value. A next step includes applying the appropriate gain target to the audio signal. A next step includes outputting the audio signal for further signal processing. For example, the audio signal can be further processed using a logarithmic amplifier (commonly referred to as a "soft" limiter) and a smoothing filter, for example.

The improved dynamic control of audio gain of the present invention may be advantageously utilized in a wide variety of applications. For example, the improved speakerphone operation of the present invention can be utilized to provide clearer communication in both wired and wireless telephone systems.

Although the invention has been described and illustrated in the above description and drawings, it is understood that this description is by way of example only and that numerous changes and modifications can be made by those skilled in the art without departing from the broad scope of the invention. Although the present invention finds particular use in portable cellular radiotelephones with speakerphone operation, the invention could be applied to any communication device, including pagers, electronic organizers, and computers, or any audio subsystem including loudspeakers, microphones, and recording equipment. Additionally, although the invention has been illustrated in the speaker path of a receiving device, the invention can be implemented in the microphone path of an originating device such that the transmitting device provides a preprocessed signal to the remote device. The present invention should be limited only by the following claims.

What is claimed is:

1. A method for dynamically controlling audio signal gain in a communication device, the method comprising the steps of:
   inputting an audio signal;
   determining a level of the audio signal;
   mapping the level of the audio signal against a table of predetermined corresponding gain targets to determine an appropriate gain target for that level;
   applying the appropriate gain target to the audio signal; and outputting the modified audio signal;
   wherein before the applying step, further comprising the step of estimating an intermediate gain value;
   wherein the estimating step further comprising the substeps of tracking the running intermediate gain value, wherein the running intermediate gain value is allowed to increase exponentially, and comparing, wherein the gain target is limited when the running intermediate gain value exceeds the gain target.

2. A method for dynamically controlling audio signal gain in a communication device, the method comprising the steps of:
   inputting an audio signal;
   determining a level of the audio signal;
   mapping the level of the audio signal against a table of predetermined corresponding gain targets to determine an appropriate pain target for that level;
   applying the appropriate pain target to the audio signal; and
   outputting the modified audio signal,
   wherein before the applying step, further comprising the step of estimating an intermediate gain value;
   wherein after the estimating step, further comprising the step of low pass filtering the intermediate gain value using a low pass exponentially decaying impulse response filter to control an attack time of the gain value.

3. A method for dynamically controlling audio signal gain in a communication device, the method comprising the steps of:
   sampling an input audio signal;
   determining an envelope value of the audio signal, the envelope value being the larger of an absolute value of the amplitude of the audio signal and an envelope estimate of the audio signal;
   tracking the envelope estimate, wherein the envelope estimate is allowed to decay exponentially;
   mapping the level of audio signal against a table of predetermined corresponding gain targets to determine an appropriate gain target for that level;
   estimating an intermediate gain value; tracking the running intermediate gain value, wherein the running intermediate gain value is allowed to increase exponentially, and wherein the gain target is limited when the running intermediate gain value exceeds the gain target;
   applying the appropriate gain target to the audio signal; and
   outputting an output audio signal.

4. The method of claim 3, wherein the mapping step includes the gain targets describing a transfer function selected from at least one of the group of expansion of the input audio signal, compression of the input audio signal, and limiting of the input audio signal.

5. The method of claim 3, wherein the communication device includes a speaker with a speakerphone mode of operation, wherein mapping step includes gain targets describing a compression of the audio signal such that a low amplitude audio signal is increased in gain.

6. The method of claim 3, wherein after the second tracking step, further comprising the step of low pass filtering the intermediate gain value using a low pass exponentially decaying impulse response filter to control an attack time of the gain value.

7. A communication device with dynamic pain control of an audio signal, the device comprising:
   an envelope tracking circuit including a comparator, the envelope tracking circuit determines a level of an input audio signal and estimates an envelope of the audio signal, and the comparator compares an absolute value of an amplitude of the input audio signal to the envelope estimate of the audio signal, and outputs the larger value thereof;
   a memory far storing a map of gain targets;
   a mapper coupled to the memory and the envelope tracking circuit, the mapper inputs the value from the comparator of the envelope tracking circuit and inputs the gain targets from the memory, the mapper maps the value from the comparator against the gain targets and outputs the associated gain target; and
   a gain stage that applies the gain target from the signal processor to the audio signal to produce an audio output with dynamically controlled gain;
   wherein the communication device includes a speaker with a speakerphone mode of operation, and wherein the gain targets describe a compression of the audio signal such that a low amplitude audio signal is increased in gain.

8. A communication device with dynamic gain control of an audio signal, the device comprising:
   an envelope tracking circuit including a comparator, the envelope tracking circuit determines a level of an input audio signal and estimates an envelope of the audio signal, and the comparator compares an absolute value of an amplitude of the input audio signal to the envelope estimate of the audio signal, and outputs the larger value thereof;
   a memory for storing a map of pain targets;

a mapper coupled to the memory and the envelope tracking circuit, the mapper inputs the value from the comparator of the envelope tracking circuit and inputs the gain targets from the memory, the mapper maps the value from the comparator against the gain targets and outputs the associated gain target; and a gain stage that applies the gain target from the signal processor to the audio signal to Produce an audio output with dynamically controlled gain;

wherein the envelope tracking circuit tracks the envelope estimate of the audio signal, wherein the envelope estimate is allowed to decay exponentially.

9. A communication device with dynamic gain control of an audio signal, the device comprising:

an envelope tracking circuit including a comparator, the envelope tracking circuit determines a level of an input audio signal and estimates an envelope of the audio signal, and the comparator compares an absolute value of an amplitude of the input audio signal to the envelope estimate of the audio signal, and outputs the larger value thereof;

a memory for storing a map of pain targets;

a mapper coupled to the memory and the envelope tracking circuit, the mapper inputs the value from the comparator of the envelope tracking circuit and inputs the gain targets from the memory, the mapper maps the value from the comparator against the pain targets and outputs the associated pain target;

a gain stage that applies the gain target from the signal processor to the audio signal to produce an audio output with dynamically controlled gain; further comprising a second comparator, the second comparator compares the pain target from the signal processor to a tracked running intermediate gain value that is allowed to increase exponentially, such that the gain target is limited when the running intermediate gain value exceeds the gain target; and further comprising an interpolator; the interpolator low pass filters the intermediate gain value using a low pass exponentially decaying impulse response filter to control an attack time of the gain value, which is subsequently applied to the gain stage.

10. A method for dynamically controlling audio signal gain in a communication device, the method comprising the steps of:

inputting an audio signal;

determining a level of the audio signal;

mapping the level of the audio signal against a table of predetermined corresponding gain targets to determine an appropriate gain target for that level;

applying the appropriate gain target to the audio signal; and outputting the modified audio signal;

wherein before the applying step, further comprising the step of estimating an intermediate gain value, wherein the steps of estimating an intermediate gain value includes selecting an intermediate gain value which is the lesser of the gain target from the mapping step and a running intermediate gain value.

* * * * *